(12) United States Patent
Aoyama et al.

(10) Patent No.: US 8,368,382 B2
(45) Date of Patent: Feb. 5, 2013

(54) FREQUENCY CHARACTERISTICS MEASURING DEVICE

(75) Inventors: Satoru Aoyama, Tokyo (JP); Wataru Doi, Tokyo (JP)

(73) Assignee: Advantest Corporation, Tokyo (JP)

( * ) Notice: Subject to any disclaimer, the term of this patent is extended or adjusted under 35 U.S.C. 154(b) by 366 days.

(21) Appl. No.: 12/865,972

(22) PCT Filed: Sep. 14, 2009

(86) PCT No.: PCT/JP2009/065989
§ 371 (c)(1),
(2), (4) Date: Aug. 3, 2010

(87) PCT Pub. No.: WO2010/035646
PCT Pub. Date: Apr. 1, 2010

(65) Prior Publication Data
US 2011/0001468 A1    Jan. 6, 2011

(30) Foreign Application Priority Data
Sep. 26, 2008    (JP) .................................. 2008-247072

(51) Int. Cl.
*G01R 23/02*    (2006.01)
*G01R 23/00*    (2006.01)
*G01R 23/14*    (2006.01)
*G01R 13/24*    (2006.01)

(52) U.S. Cl. ............... 324/76.39; 324/76.19; 324/76.23; 324/76.27

(58) Field of Classification Search .............. 324/76.39, 324/76.11, 76.19, 76.23, 76.27; 375/148, 375/285, 346
See application file for complete search history.

(56) References Cited

U.S. PATENT DOCUMENTS

| | | | | |
|---|---|---|---|---|
| 5,847,559 A * | 12/1998 | Takaoku et al. | ............ | 324/76.27 |
| 6,060,878 A * | 5/2000 | Doi | ............................. | 324/76.27 |
| 6,219,376 B1 * | 4/2001 | Zhodzishsky et al. | ........ | 375/148 |
| 7,952,344 B2 * | 5/2011 | Doi et al. | .................... | 324/76.19 |
| 2009/0195239 A1 * | 8/2009 | Doi et al. | .................... | 324/76.19 |
| 2010/0141239 A1 * | 6/2010 | Ortler | ........................ | 324/76.39 |
| 2010/0259245 A1 * | 10/2010 | Kunie et al. | ................ | 324/76.23 |
| 2011/0057643 A1 * | 3/2011 | Su et al. | ..................... | 324/76.39 |

FOREIGN PATENT DOCUMENTS

| | | |
|---|---|---|
| JP | 08-56242 A | 2/1996 |
| JP | 09-321717 A | 12/1997 |
| JP | 10-282163 | 10/1998 |
| JP | 2006-329981 | 12/2006 |
| JP | 2008-145145 | 6/2008 |

* cited by examiner

*Primary Examiner* — Hoai-An D Nguyen
(74) *Attorney, Agent, or Firm* — patenttm.us

(57) ABSTRACT

A spectrum analyzer includes: two sets of measuring units having mixers, local oscillators, and IF sections for separately measuring frequency characteristics of two input signals; a trigger control section which generates a trigger signal for specifying a measurement start timing in each of the two sets of measuring units; a sweep control section which simultaneously sends an instruction to the two local oscillators when a trigger signal is inputted and performs a sweep control so that the two local oscillators output local oscillation signals of the same frequency at the same timing. This provides a frequency characteristics measuring device which can simplify the configuration for performing a measurement and reduce the undue effort required for the measurement.

15 Claims, 5 Drawing Sheets

FREQUENCY CHARACTERISTICS MEASURING DEVICE

TECHNICAL FIELD

The present invention relates to a frequency characteristics measuring device for measuring a frequency characteristic or the like of an input signal in a spectrum analyzer or the like.

BACKGROUND ART

A spectrum analyzer is conventionally known which measures a frequency characteristic of an input signal by performing frequency sweep (see, for example, Patent Document 1). The spectrum analyzer has input terminals in two lines and measures a frequency characteristic of a signal input through one of the input terminals. The measured frequency characteristic is displayed through a display section.
Patent Document 1: Japanese Patent Laid-Open No. 8-233875 (pp. 3-4, FIGS. 1-2)

DISCLOSURE OF THE INVENTION

Problems to be Solved by the Invention

The conventional spectrum analyzer disclosed in Patent Document 1 for example has two input terminals but performs measurement of a frequency characteristic with respect to a signal input through one of the two input terminals. Therefore, simultaneously making measurements of frequency characteristics of two kinds of signals requires two spectrum analyzers and an externally attached trigger device for generating a trigger signal for synchronization of the measurements, and there is a problem that the configuration for measurement is complicated and considerable amounts of time and work are required for measurement. As a method of comparing frequency characteristics of two kinds of signals, a method of printing and comparing corresponding measurement results is conceivable. This method, however, has a problem that it is difficult to perform analysis with accuracy. As another method of comparing frequency characteristics of two kinds of signals, a method of capturing frequency characteristics of two kinds of signals obtained by measurement in an external analysis device (external computer) and making comparison by performing data processing thereon is conceivable. This method requires the provision of an analysis device and performing an analysis operation separately from measurement and therefore has a problem that the configuration for measurement is further complicated and considerable amounts of time and work are required for measurement.

The present invention has been created in consideration of these points and an object of the present invention is to provide a frequency characteristic measuring device capable of simplifying the configuration for measurement and reducing the amounts of time and work required for measurement.

Solution to Problem

To solve the above-described problems, the present invention provides a frequency characteristics measuring device having a plurality of measuring units which respectively measure frequency characteristics of a plurality of input signals, a trigger control unit which outputs a plurality of trigger signals designating measurement start timing in each of the plurality of measuring units, and a sweep control unit which controls frequency sweep operations in each of the plurality of measuring units in synchronization with the plurality of trigger signals output from the trigger control unit. Making measurements on a plurality of input signals in parallel with each other in synchronization with a trigger signal internally generated is thereby enabled and the need for a device externally connected is eliminated. Consequently, the configuration for measurement can be simplified and the amounts of time and work required for measurement can be reduced.

It is desirable that each of the above-described plurality of measuring units include a local oscillator whose oscillation frequency can be changed, and a mixer which mixes a local oscillation signal output from the local oscillator and a signal inputted through an input terminal and outputs the mixed signals; a state signal indicating the operating state of the local oscillator be output from the local oscillator; and the sweep control unit perform control of the frequency sweep operation in the measuring unit including the local oscillator regarded as being in an operational state according to a notice given by means of the state signal. In this way, frequency sweep control can be performed by checking the frequency-sweepable state.

It is desirable that the above-described sweep control unit have a selecting unit which selects any one of the plurality of trigger signals, and a plurality of sweep units which individually control the frequency sweep operations in each of the plurality of measuring units in synchronization with the one trigger signal selected by the selecting unit. This enables frequency sweep to be started by the same timing in the plurality of measuring units. In this way, timing of measurement of frequency characteristics can be easily adjusted.

It is desirable that the above-described sweep control unit have a plurality of selecting units which select the plurality of trigger signals so as not to doubly select any of the trigger signals, and a plurality of sweep units which individually control the frequency sweep operations in the plurality of measuring units respectively in synchronization with the trigger signals selected by the plurality of selecting units. This enables the measuring operations in a plurality of systems to be independently performed as in the case of using a plurality of frequency characteristic measuring devices.

It is desirable that the above-described sweep control unit have a selecting unit which selects any one of the plurality of trigger signals, a plurality of sweep units to which one of the trigger signals selected by the selecting unit is input, and which individually control the frequency sweep operations in each of the plurality of measuring units in synchronization with the trigger signal, and a trigger input limiting unit which permits input of the trigger signal to the plurality of sweep units when all the state signals respectively corresponding to the plurality of measuring units indicate being in the operational state. The trigger signal is thereby input to each sweep unit when frequency sweep can be performed in all the measuring units, so that measurements in the two systems can be simultaneously started with improved reliability.

It is desirable that each of the above-described plurality of sweep units perform operations to control the frequency sweep operations in each of the plurality of measuring units when all the state signals respectively corresponding to the plurality of measuring units indicate being in the operational state. This enables stopping frequency sweep in all the measuring units when frequency sweep cannot be performed in a part of the measuring units. Consequently, not only timing of starts of measurement in the plurality of measuring units but also timing of the operations during frequency sweep can be reliably adjusted.

It is desirable that the above-described sweep control unit have a selecting unit which selects any one of the plurality of trigger signals, a plurality of sweep units to which one of the trigger signals selected by the selecting unit is input, and which individually control the frequency sweep operations in each of the plurality of measuring units in synchronization with the trigger signal, and a delay unit which delays timing of input of the trigger signal by a predetermined length of time with respect to part of the plurality of measuring units. In this way, timing of inputting of the trigger signal to the plurality of sweep units can be made different from each other by a predetermined length of time with accuracy to set a time difference with accuracy between moments at which frequency sweep is started when measurement is performed in the plurality of systems.

DESCRIPTION OF EMBODIMENTS

Figure 1:
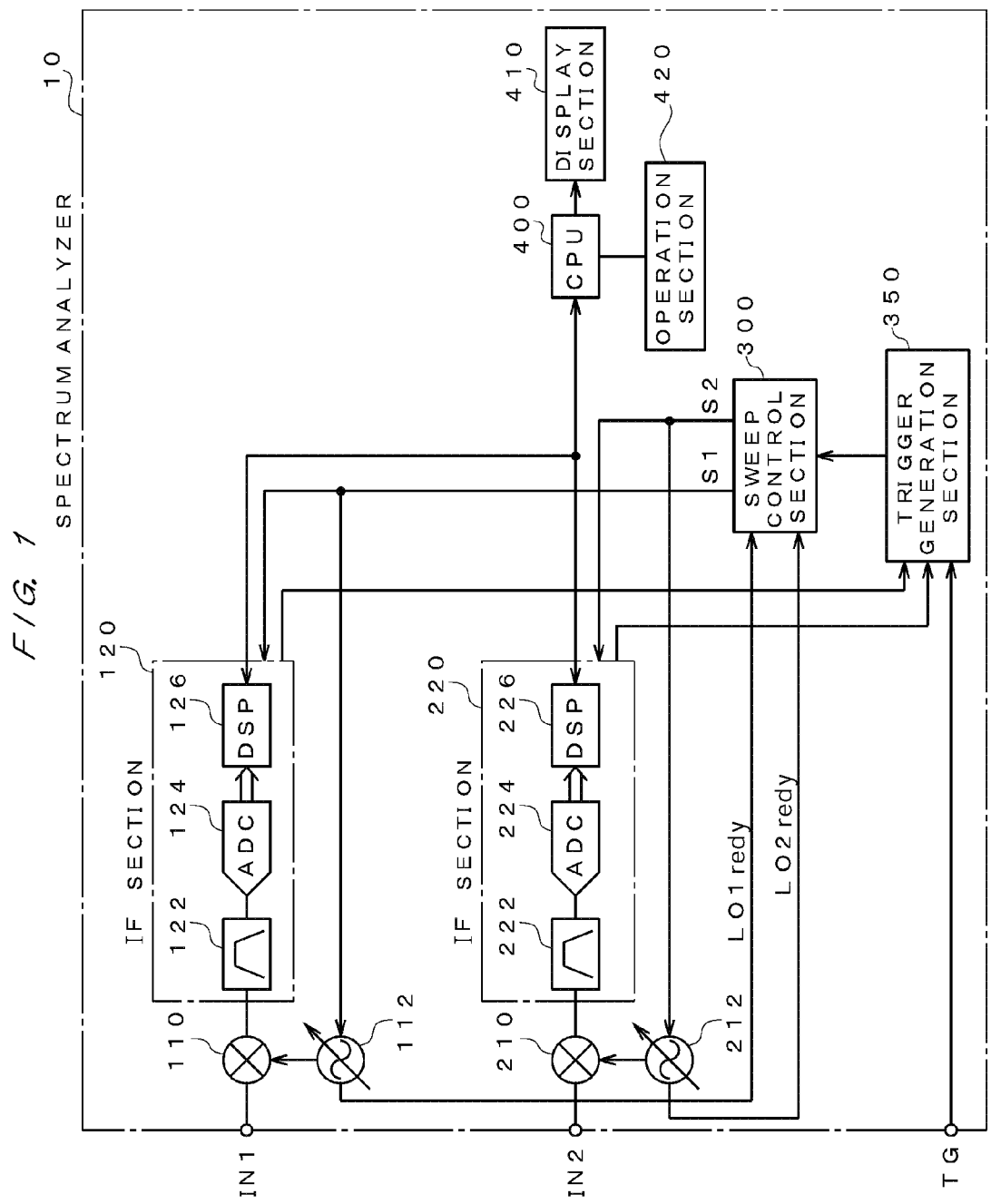
FIG. 1 is a diagram showing the configuration of a spectrum analyzer in an embodiment of the present invention.

A spectrum analyzer which is a frequency characteristics measuring device according to an embodiment of the present invention will be described in detail with reference to the drawings. FIG. 1 is a diagram showing the configuration of a spectrum analyzer in an embodiment of the present invention. As shown in FIG. 1, the spectrum analyzer 10 in the present embodiment includes mixers 110 and 210, local oscillators 112 and 212, IF sections (intermediate frequency processing sections) 120 and 220, a sweep control section 300, a trigger control section 350, a CPU 400, a display section 410, and an operation section 420.

The spectrum analyzer 10 in the present embodiment has two input terminals IN1 and IN2 through which measurement target signals (signals to be measured) are input and a trigger terminal TG through which an external trigger signal is input. The spectrum analyzer 10 simultaneously measures frequency characteristics of two measurement target signals fin1 and fin2 input through these two input terminals IN1 and IN2, and displays spectrums as measurement results.

The mixer 110, the local oscillator 112 and the IF section 120 are provided with the spectrum analyzer 10 to measure frequency characteristics of the measurement target signal fin1 input through one input terminal IN1. The mixer 110 is supplied with the measurement target signal fin1 input through one input terminal IN1 and a local oscillation signal $f_{osc1}$ output from the local oscillator 112, and outputs a signal which is a mixture of the measurement target signal fin1 and the local oscillation signal $f_{osc1}$. The local oscillator 112 outputs the local oscillation signal $f_{osc1}$ whose oscillation frequency is sweepable through a predetermined range. For example, the local oscillator 112 is constituted by a PLL circuit including a variable frequency divider, a phase comparator, a VCO (voltage-controlled oscillator). To broaden the variable frequency range of the local oscillation signal output from the local oscillator 112, a plurality of VCOs having different variable frequency ranges are ordinarily used. When the frequency of the local oscillation signal is changed in one direction, the VCO to be used is changed (band selection is made).

The IF section 120 performs analog signal processing and digital signal processing on the output signal from the mixer 110 to perform measurement of frequency characteristics of the measurement target signal fin1. The IF section 120 includes an intermediate frequency filter 122, an ADC (analog-to-digital converter) 124 and a DSP (digital signal processor) 126. The intermediate frequency filter 122 is a band-pass filter which allows only a predetermined intermediate frequency component (intermediate frequency signal) in the output signal from the mixer 110 to pass therethrough. The ADC 124 converts the intermediate frequency signal output from the intermediate frequency filter 122 into digital data at a predetermined sampling frequency. The DSP 126 performs various kinds of signal processing on the intermediate frequency signal converted into digital data to measure characteristic values (e.g., the signal level and the bit error rate) of the intermediate frequency signal. More specifically, the DSP 126 performs processing including detection processing and image removal processing on the intermediate frequency signal.

Similarly, the mixer 210, the local oscillator 212 and the IF section 220 are provided with the spectrum analyzer 10 to measure frequency characteristics of the measurement target signal fin2 input through the other input terminal IN2. The mixer 210 is supplied with the measurement target signal fin2 input through the other input terminal IN2 and a local oscillation signal $f_{OSC2}$ output from the local oscillator 212, and outputs a signal which is a mixture of the measurement target signal fin2 and the local oscillation signal $f_{OSC2}$. The local oscillator 212 outputs the local oscillation signal $f_{OSC2}$ whose oscillation frequency is sweepable through a predetermined range. For example, the local oscillator 212 is constituted by a PLL circuit including a variable frequency divider, a phase comparator, a VCO (voltage-controlled oscillator), as is the local oscillator 112. To broaden the variable frequency range of the local oscillation signal output from the local oscillator 212, a plurality of VCOs having different variable frequency ranges are ordinarily used. When the frequency of the local oscillation signal is changed in one direction, the VCO to be used is changed (a band selection is made).

The IF section 220 performs analog signal processing and digital signal processing on the output signal from the mixer 210 to perform measurement of frequency characteristics of the measurement target signal fin2. The IF section 220 includes an intermediate frequency filter 222, an ADC 224 and a DSP 226. The intermediate frequency filter 222 is a band-pass filter which allows only a predetermined intermediate frequency component (intermediate frequency signal) in the output signal from the mixer 210 to pass therethrough. The ADC 224 converts the intermediate frequency signal output from the intermediate frequency filter 222 into digital data by sampling at a predetermined sampling frequency. The DSP 226 performs various kinds of signal processing on the intermediate frequency signal converted into digital data to measure characteristic values of the intermediate frequency signal. More specifically, the DSP 226 performs processing including demodulation processing and image removal processing on the intermediate frequency signal.

Only the essential portion of the configuration necessary for measurement of frequency characteristics has been described. In actuality, however, attenuators are provided between the input terminal IN1 and the mixer 110 and between the input terminal IN2 and the mixer 210 to perform signal level adjustment. Also, in actuality, a combination of a mixer and a local oscillator or a plurality of combinations of mixers and local oscillators are added to perform image removal processing. The configuration necessary for frequency measurement can be changed as desired according to required specifications.

The sweep control section 300 is supplied with two kinds of trigger signals T1 and T2 and LO1redy and LO2redy signals respectively output from the local oscillators 112 and 212, and sends sweep signals S1 and S2 to the two local oscillators 112 and 212, respectively, thereby performing sweep control on each of the two local oscillators 112 and 212. The LO1redy signal is a signal indicating the state of operation of the local oscillator 112. For example, the LO1redy signal becomes high level at the time of entering in a sweepable state (enabled state). For example, in a situation where a band selection is made by changing the VCO during frequency sweep, the LO1redy signal becomes low level when this band selection is being made. The LO1redy signal again becomes high level when the band selection is completed. The same applies to the LO2redy signal.

The trigger control section 350 generates the trigger signals T1 and T2 each instructing a start of measurement. The trigger signals T1 and T2 are generated in synchronization with an external trigger signal input through the trigger terminal TG, IF trigger signals output from the IF sections 120 and 220, video trigger signals or the like.

The CPU 400 performs overall control of the spectrum analyzer 10 and performs processing for simultaneously displaying through the display section 410 the two measurement results (characteristic values) output from the IF sections 120 and 220 and processing for setting a measurement condition according to a command from a user using the operation section 420. The operation section 420 is provided with a plurality of components such as switches and operating variable resistors to be operated by a user. A user enters a command to set a measurement condition, a command to start measuring, a command to stop measuring and other commands by operating the switches, the operating variable resistors or the like provided in the operation section 420.

A concrete example of the generation of the sweep signals S1 and S2 by the sweep control section 300 on the basis of the trigger signals T1 and T2 output from the trigger control section 350 will next be described. Concrete examples of the sweep control section 300 realizing, for example, four cases (cases 1 to 4) described below will be described.

(Case 1)

Figure 2:
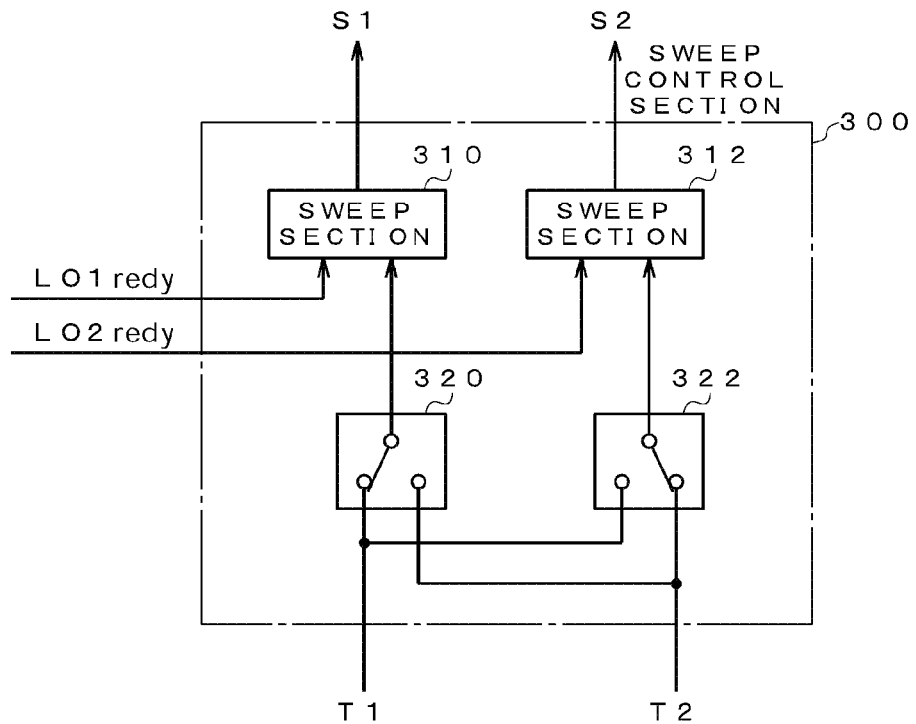
FIG. 2 is a diagram showing in detail the configuration of the sweep control section in accordance with case 1.

FIG. 2 is a diagram showing in detail the configuration of the sweep control section 300 in accordance with case 1. The sweep control section 300 shown in FIG. 2 includes two sweep sections 310 and 312 and two switch sections 320 and 322. The sweep section 310 outputs the sweep signal S1 necessary for sweeping the frequency of the local oscillator 112. In case where the local oscillator 112 is constituted by a PLL circuit including a variable frequency divider, a phase comparator and a VCO as described above, the sweep section 310 generates the sweep signal S1 instructing a start and an end of the sweep operation by which the division ratio of the variable frequency divider is changed in one direction, and outputs the sweep signal S1. The sweep signal S1 is input to the local oscillator 112. Also, the sweep section 310 is supplied with the LO1redy signal input from the local oscillator 112 and the trigger signal T1 (or T2) input via the switch section 320. When supplied with the trigger signal T1 or the like when the LO1redy signal is high level, the sweep section 310 starts outputting the sweep signal S1. The sweep signal S1 is also input to the IF section 120 to notify the IF section 120 of the start and end of sweep control.

Similarly, the sweep section 312 outputs the sweep signal S2 necessary for sweeping the frequency of the local oscillator 212. In case where the local oscillator 212 is constituted by a PLL circuit including a variable frequency divider, a phase comparator and a VCO, the sweep section 312 generates the sweep signal S2 instructing a start and an end of the sweep operation by which the division ratio of the variable frequency divider is changed in one direction, and outputs the sweep signal S2. The sweep signal S2 is input to the local oscillator 212. Also, the sweep section 312 is supplied with the LO2redy signal input from the local oscillator 212 and the trigger signal T2 (or T1) input via the switch section 322. When supplied with the trigger signal T2 or the like when the LO2redy signal is high level, the sweep section 312 starts outputting the sweep signal S2. The sweep signal S2 is also input to the IF section 220 to notify the IF section 220 of the start and end of sweep control.

The switch section 320 selectively outputs one of the two trigger signals T1 and T2 toward the sweep section 310. The switch section 322 selectively outputs one of the two trigger signals T1 and T2 toward the sweep section 312. In the example shown in FIG. 2, the trigger signal T1 is selected in the switch section 320 to be input to the sweep section 310. Also, the trigger signal T2 is selected in the switch section 322 to be input to the sweep section 312.

Setting the switching states (selecting states) of the two switch sections 320 and 322 in the above-described way enables the measurement of the frequency characteristics of the measurement target signal fin1 input from one input terminal IN1 to be measured in synchronization with the trigger signal T1 and enables the measurement of the frequency characteristics of the measurement target signal fin2 input from the other input terminal IN2 to be measured in synchronization with the trigger signal T2. The measuring operations in the two systems can be performed independently of each other.

Figure 3:
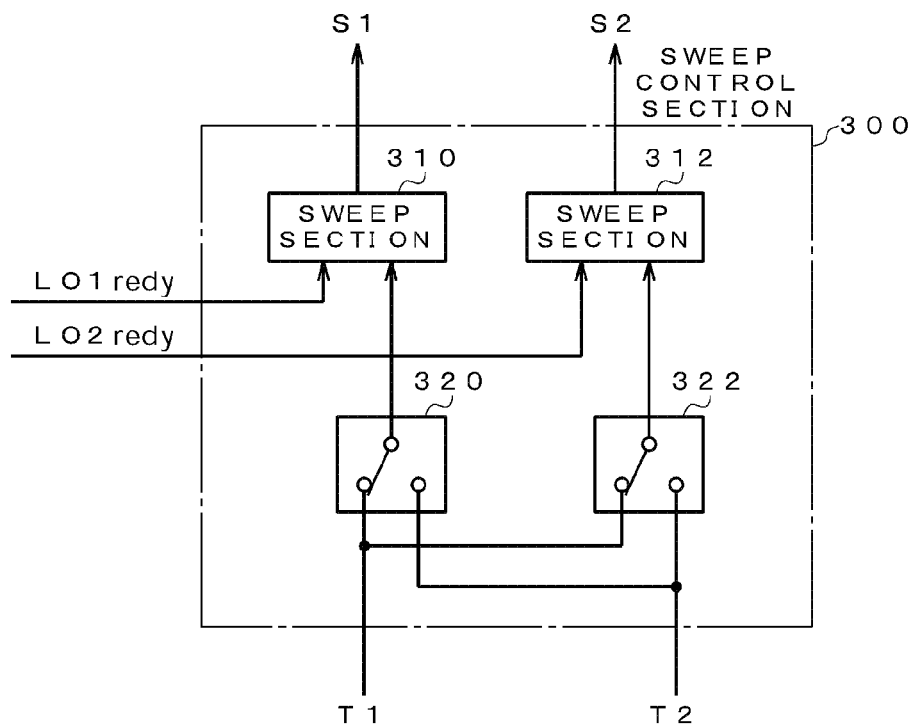
FIG. 3 is a diagram showing in detail the configuration of the sweep control section in accordance with case 1.

It is also possible to perform the measuring operations in the two systems in synchronization with one trigger signal T1 (or T2) by changing the switching states of the switch sections 320 and 322. FIG. 3 shows in detail the configuration of the sweep control section 300 in a case where the switching state of the switch section 322 is changed. The configuration shown in FIG. 3 is the same as that shown in FIG. 2 except for changing only the switching state of the switch section 322.

In the example shown in FIG. 3, the trigger signal T1 is selected in the switch section 320 to be input to the sweep section 310, and the trigger signal T1 is selected in the switch section 322 to be input to the sweep section 312. That is, one trigger signal T1 is selected by two switch sections 320 and 322 to be input to the two sweep sections 310 and 312. Accordingly, the times at which the sweep signals S1 and S2 are output from the sweep sections 310 and 312 coincide with each other and it is possible to make measurements in the two systems in synchronization with one trigger signal T1. Sweep control performed in synchronization with an IF trigger signal output according to the IF level (intermediate frequency signal level) of bursts, for example, when high-frequency components of the bursts are measured has conventionally been practiced. In the conventional art, sweep control cannot be performed if the IF level is so low that the IF trigger signal cannot be produced. However, the configuration shown in FIG. 3 enables measurement of harmonic waves of bursts in synchronization with the trigger signal T1 as well as measurement of the fundamental wave of bursts in synchronization with the same trigger signal T1.

(Case 2)

Figure 4:
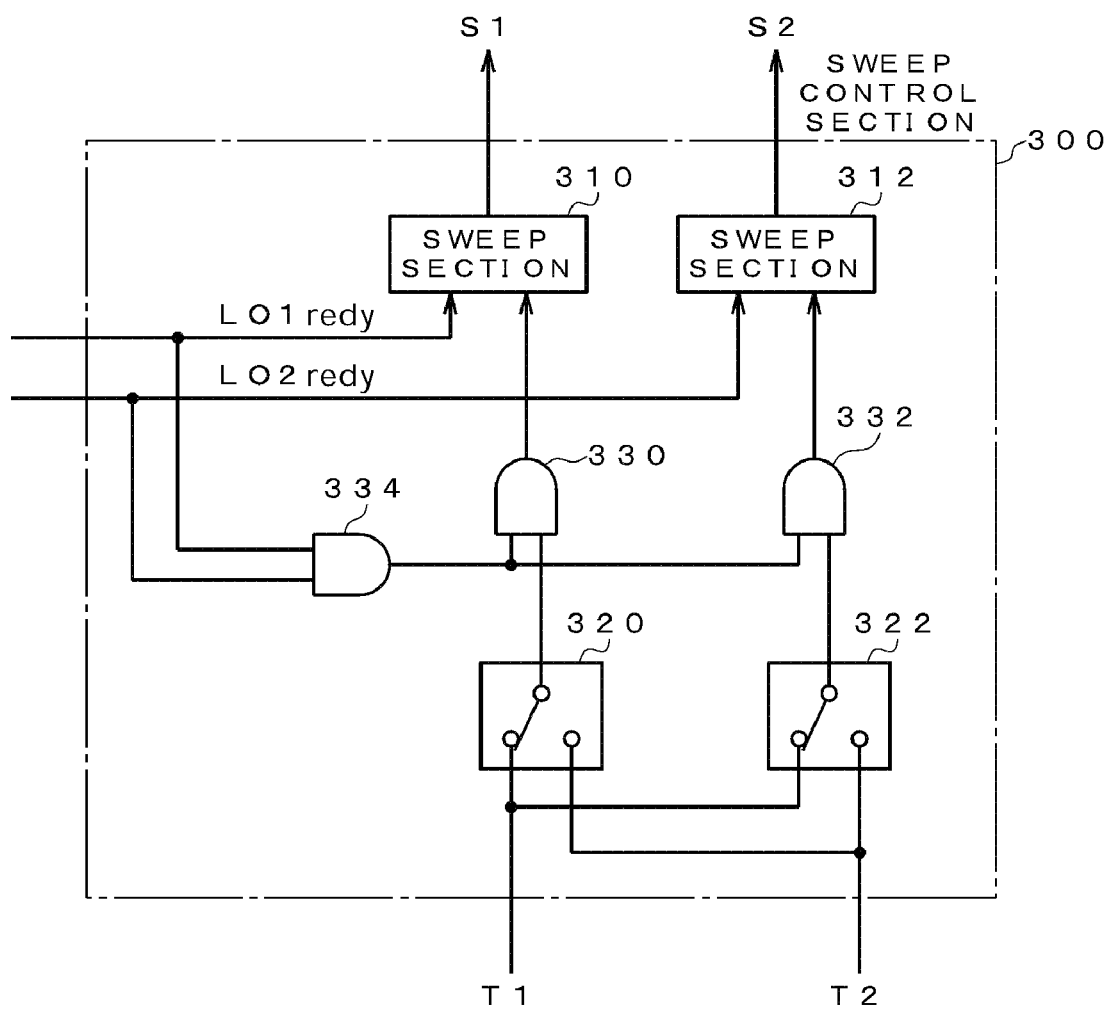
FIG. 4 is a diagram showing in detail the configuration of the sweep control section in accordance with case 2.

FIG. 4 is a diagram showing in detail the configuration of the sweep control section 300 in accordance with case 2. The sweep control section 300 shown in FIG. 4 includes two sweep sections 310 and 312, two switch sections 320 and 322, and three AND circuits 330, 332, and 334. The configuration shown in FIG. 4 differs from the configuration shown in FIG. 3 in that three AND circuits 330, 332, and 334 are added. Description will be made below by noting mainly this point of difference.

The AND circuit 330 is inserted between the switch section 320 and the sweep section 310. The trigger signal T1 output from the switch section 320 is input to one input end of the AND circuit 330, while an output end of the AND circuit 334 is connected to the other input end of the AND circuit 330. The AND circuit 332 is inserted between the switch section 322 and the sweep section 312. The trigger signal T1 output from the switch section 322 is input to one input end of the AND circuit 332, while the output end of the AND circuit 334 is connected to the other input end of the AND circuit 332. The AND circuit 334 has the LO1redy signal and the LO2redy signal input to its two input ends, respectively, and outputs a signal representing the logical product of the LO1redy signal and the LO2redy signal. That is, the AND circuit 334 outputs a high level signal when both the LO1redy signal and the LO2redy signal are in an enabled state (high level).

The example shown in FIG. 4 has in common with the example shown in FIG. 3 a feature which resides in inputting the trigger signal T1 to the two sweep sections 310 and 312, but differs from the example shown in FIG. 3 in that inputting of the trigger signal T1 to the two sweep sections 310 and 312 is not performed unless both the LO1redy signal and the LO2redy signal are high level. That is, only when both the two local oscillators 112 and 212 are operational, the trigger signal T1 is input to the two sweep sections 310 and 312 to enable outputting the sweep signals S1 and S2 simultaneously with each other from the two sweep sections 310 and 312 in synchronization with the trigger signal T1, thus enabling measurements on the measurement target signals to be simultaneously started with improved reliability.

While outputting of the two sweep signals S1 and S2 in synchronization with the trigger signal T1 has been described, the two sweep signals S1 and S2 may be output in synchronization with the trigger signal T2.

(Case 3)

Figure 5:
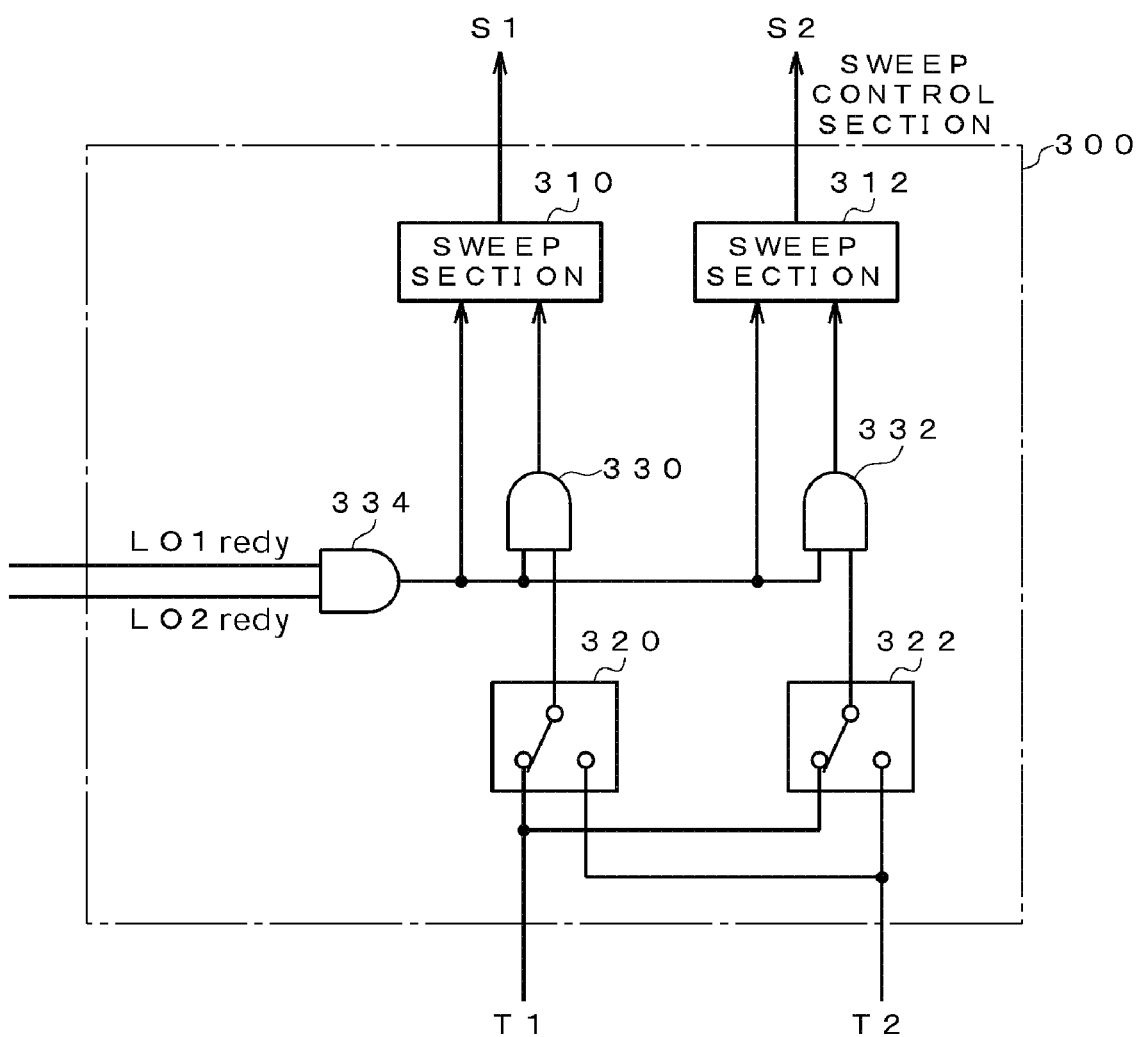
FIG. 5 is a diagram showing in detail the configuration of the sweep control section in accordance with case 3.

FIG. 5 is a diagram showing in detail the configuration of the sweep control section 300 in accordance with case 3. The sweep control section 300 shown in FIG. 5 includes two sweep sections 310 and 312, two switch sections 320 and 322, and three AND circuits 330, 332, and 334. The configuration shown in FIG. 5 differs from the configuration shown in FIG. 4 in input routing of the LO1redy signal and the LO2redy signal. Description will be made below by noting mainly this point of difference.

More specifically, the example shown in FIG. 5 differs from the example shown in FIG. 4 in that the output signal from the AND circuit 334 (the signal representing the logical product of the LO1redy signal and the LO2redy signal) is input to the sweep section 310 in place of the LO1redy signal, and that the output signal from the AND circuit 334 is input to the sweep section 312 in place of the LO2redy signal. That is, the two sweep sections 310 and 312 are operational only when both the LO1redy signal and the LO2redy signal are high level, and the trigger signal T1 (or T2) is input to the sweep sections 310 and 312 only when both the LO1redy signal and the LO2redy signal are high level. Accordingly, when only one of the local oscillators, e.g., the local oscillator 112 is made non-operational (disabled state) by band selection, outputting of the sweep signal S1 from the sweep section 310 and outputting of the sweep signal S2 from the sweep section 312 are simultaneously stopped to simultaneously stop making measurements in the two systems. Thereafter, when band selection in the local oscillator 112 is completed, the measurements in the two systems can be restarted simultaneously by restarting outputting of the sweep signal S1 and outputting of the sweep signal S2 by the same timing. Thus, not only timing of starts of measurement in the two systems but also timing of the operations during frequency sweep can be reliably adjusted.

(Case 4)

Figure 6:
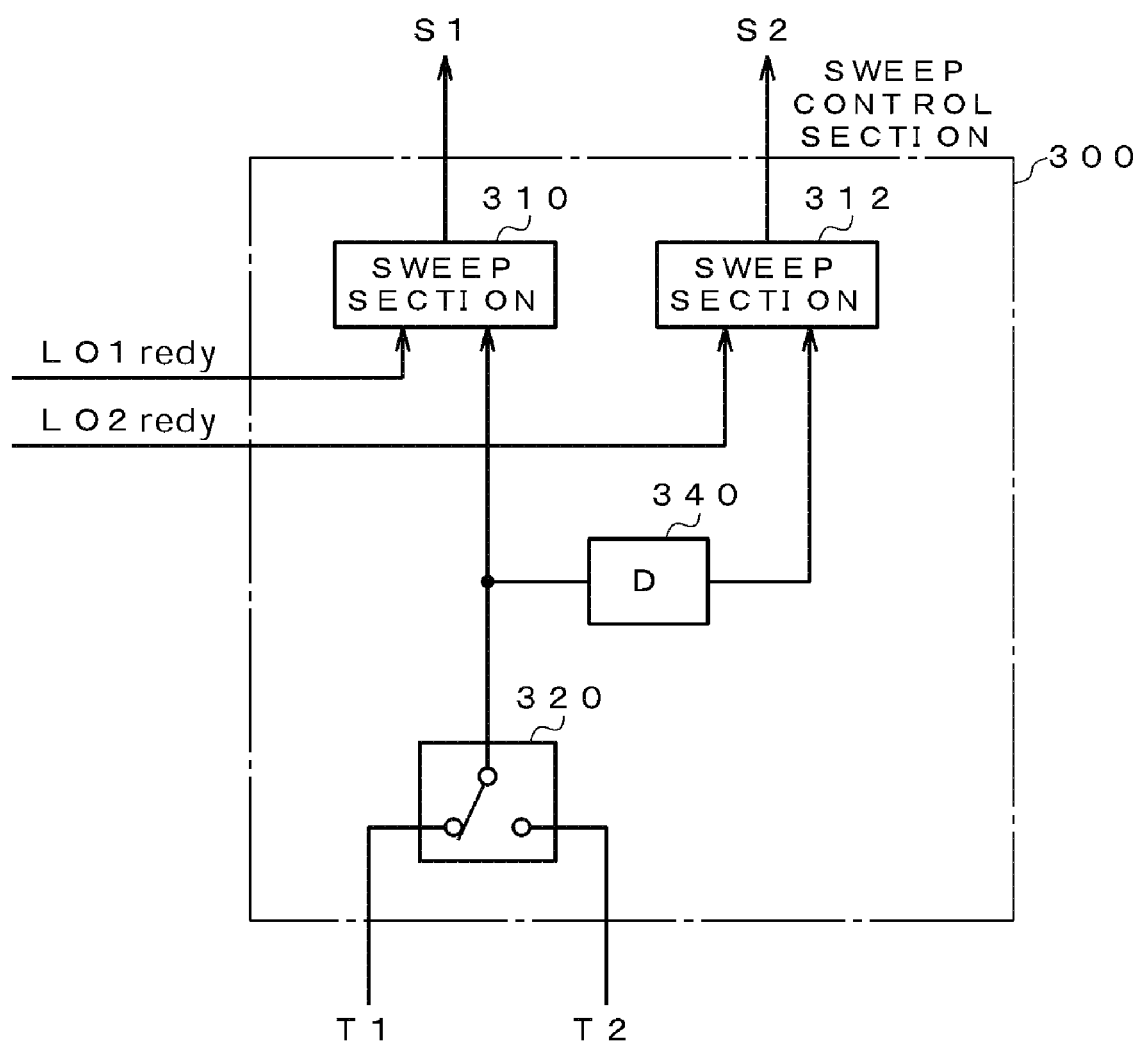
FIG. 6 is a diagram showing in detail the configuration of the sweep control section in accordance with case 4.

FIG. 6 is a diagram showing in detail the configuration of the sweep control section 300 in accordance with case 4. The sweep control section 300 shown in FIG. 6 includes two sweep sections 310 and 312, a switch section 320, and a delay section (D) 340. The configuration shown in FIG. 6 differs from the configuration shown in FIG. 2 in that the switch section 322 is removed and the delay section 340 is added. Description will be made below by noting mainly this point of difference.

More specifically, the trigger signal T1 (or T2) selectively output from the switch section 320 is directly input to the sweep section 310 and is also input to the sweep section 312 via the delay section 340. The delay section 340 delays the trigger signal T1 (or T2) by a predetermined length of time t and thereafter outputs the trigger signal. This length of time t can be arbitrarily set within a predetermined range. For example, the length of time t is set by the CPU 400. In this way, timing of inputting of the trigger signal T1 to the sweep section 310 and timing of inputting of the trigger signal T1 to the sweep section 312 can be made different from each other by the length of time t with accuracy to set a time difference accurately equal to the length of time t between moments at which frequency sweep is started when measurement is performed in the two systems.

The above-described mixers 110 and 210, local oscillators 112 and 212 and IF sections 120 and 220 correspond to the plurality of measuring units; the trigger control section 350 corresponds to the trigger control unit; and the sweep control section 300 corresponds to the sweep control unit. Also, the switch sections 320 and 322 correspond to the selecting unit; the sweep sections 310 and 312 correspond to the sweep units; the AND circuits 330, 332, and 334 correspond to the trigger input limiting unit; and the delay section 340 corresponds to the delay unit.

The present invention is not limited to the above-described embodiment. Various changes and modifications may be made in the embodiment within the scope of the present invention. Of the above-described embodiment, details of the configurations of the sweep control section 300 in accordance with cases 1 to 4 have been individually shown with reference to FIGS. 2 to 6, respectively. However, one sweep control section 300 may have all or some of those configurations.

While in the above-described embodiment two identical combinations of components are provided to simultaneously measure frequency characteristics of two input signals, three or more identical combinations of components may be provided to simultaneously measure frequency characteristics of three or more input signals.

While two DSPs 126 and 226 are provided in the above-described embodiment, one DSP 126 may perform the processing for the other DSP 226 if its throughput is sufficiently high, and the other DSP 226 may be removed. The manufacturing cost can be reduced by reducing the number of component parts in this way.

INDUSTRIAL APPLICABILITY

According to the present invention, measurements can be made in parallel with each other on a plurality of input signals in synchronization with a trigger signal internally generated and the need for an externally connected device is eliminated, so that the configuration for measurement can be simplified and the amounts of time and work required for measurement can be reduced.

REFERENCE SIGNS LIST

10 Spectrum analyzer
110, 210 Mixer
112, 212 Local oscillator
120, 220 IF section (intermediate frequency processing section)
122, 222 Intermediate frequency filter
124, 224 ADC (analog-digital converter)
126, 226 DSP (digital signal processor)
300 Sweep control section
310, 312 Sweep section
320, 322 Switch section
330, 332, 334 AND circuit
340 Delay section
350 Trigger control section
400 CPU
410 Display section
420 Operation section

The invention claimed is:

1. A frequency characteristics measuring device comprising:
a plurality of measuring units which respectively measure frequency characteristics of a plurality of input signals;
a trigger control unit which outputs a plurality of trigger signals designating measurement start timing in each of the plurality of measuring units; and
a sweep control unit which controls frequency sweep operations in each of the plurality of measuring units in synchronization with the plurality of trigger signals output from the trigger control unit, wherein the sweep control unit has:
a selecting unit which selects any one of the plurality of trigger signals; and
a plurality of sweep units which individually control the frequency sweep operations in each of the plurality of measuring units in synchronization with the one trigger signal selected by the selecting unit.

2. The frequency characteristics measuring device according to claim 1, wherein each of the plurality of measuring units includes a local oscillator whose oscillation frequency can be changed, and a mixer which mixes a local oscillation signal output from the local oscillator and a signal inputted through an input terminal and outputs the mixed signals,
wherein a state signal indicating the operating state of the local oscillator is output from the local oscillator, and
wherein the sweep control unit performs control of the frequency sweep operation in the measuring unit including the local oscillator regarded as being in an operational state according to a notice given by means of the state signal.

3. The frequency characteristics measuring device according to claim 1, wherein the sweep control unit has:
the one trigger signal selected by the selecting unit is input to the plurality of sweep units; and
a delay unit which delays timing of input of the trigger signal by a predetermined length of time with respect to part of the plurality of measuring units.

4. The frequency characteristics measuring device according to claim 1, wherein each of the plurality of measuring units has a local oscillator constituted by a PLL circuit including a variable frequency divider, a phase comparator and a VCO, and
wherein the sweep control unit controls the frequency sweep operation by changing the frequency dividing ratio of the variable frequency divider.

5. The frequency characteristics measuring device according to claim 2, wherein the sweep control unit has:
one of the trigger signals selected by the selecting unit is inputted to the plurality of sweep units; and
a trigger input limiting unit which permits input of the trigger signal to the plurality of sweep units when all the state signals respectively corresponding to the plurality of measuring units indicate being in the operational state.

6. The frequency characteristics measuring device according to claim 5, wherein each of the plurality of sweep units performs operations to control the frequency sweep operations in each of the plurality of measuring units when all the state signals respectively corresponding to the plurality of measuring units indicate being in the operational state.

7. The frequency characteristics measuring device according to claim 4, wherein the local oscillator has a plurality of the VCOs having different variable frequency ranges,
wherein the plurality of VCOs are changed from one to another.

8. The frequency characteristics measuring device according to claim 1, wherein each of the plurality of measuring units has a local oscillator which outputs a frequency-sweepable local oscillation signal, a mixer which mixes the local oscillation signal and the input signal, and an intermediate frequency processing section which measures a frequency characteristic of a signal output from the mixer.

9. The frequency characteristics measuring device according to claim 8, wherein the intermediate frequency processing section has a band-pass filter which allows only a predetermined intermediate frequency component in the signal output from the mixer to pass therethrough, an analog-to-digital converter which converts an intermediate frequency signal output from the band-pass filter into digital data at a predetermined sampling frequency, and a DSP which performs signal processing on data output from the analog-to-digital converter to measure a characteristic value of the intermediate frequency signal.

10. The frequency characteristics measuring device according to claim 9, wherein the characteristic value measured by the DSP is a signal level.

11. The frequency characteristics measuring device according to claim 9, wherein the characteristic value measured by the DSP is a bit error rate.

12. A frequency characteristics measuring device comprising:
a plurality of measuring units which respectively measure frequency characteristics of a plurality of input signals;
a trigger control unit which outputs a plurality of trigger signals designating measurement start timing in each of the plurality of measuring units; and a sweep control unit which controls frequency sweep operations in each of the plurality of measuring units in synchronization with the plurality of trigger signals output from the trigger control unit, wherein the sweep control unit has:

a plurality of selecting units which select the plurality of trigger signals so as not to doubly select any of the trigger signals; and a plurality of sweep units which individually control the frequency sweep operations in the plurality of measuring units respectively in synchronization with the trigger signals selected by the plurality of selecting units.

13. A frequency characteristics measuring device comprising:

a plurality of measuring units which respectively measure frequency characteristics of a plurality of input signals;

a trigger control unit which outputs a plurality of trigger signals designating measurement start timing in each of the plurality of measuring units; and a sweep control unit which controls frequency sweep operations in each of the plurality of measuring units in synchronization with the plurality of trigger signals output from the trigger control unit, wherein each of the plurality of measuring units includes a local oscillator whose oscillation frequency can be changed, and a mixer which mixes a local oscillation signal output from the local oscillator and a signal inputted through an input terminal and outputs the mixed signals, wherein a state signal indicating the operating state of the local oscillator is output from the local oscillator, and wherein the sweep control unit performs control of the frequency sweep operation in the measuring unit including the local oscillator regarded as being in an operational state according to a notice given by means of the state signal, and wherein the sweep control unit has:

a selecting unit which selects any one of the plurality of trigger signals;

a plurality of sweep units to which one of the trigger signals selected by the selecting unit is inputted, and which individually control the frequency sweep operations in each of the plurality of measuring units in synchronization with the trigger signal; and a trigger input limiting unit which permits input of the trigger signal to the plurality of sweep units when all the state signals respectively corresponding to the plurality of measuring units indicate being in the operational state.

14. The frequency characteristics measuring device according to claim 13, wherein each of the plurality of sweep units performs operations to control the frequency sweep operations in each of the plurality of measuring units when all the state signals respectively corresponding to the plurality of measuring units indicate being in the operational state.

15. A frequency characteristics measuring device comprising:

a plurality of measuring units which respectively measure frequency characteristics of a plurality of input signals;

a trigger control unit which outputs a plurality of trigger signals designating measurement start timing in each of the plurality of measuring units; and a sweep control unit which controls frequency sweep operations in each of the plurality of measuring units in synchronization with the plurality of trigger signals output from the trigger control unit, wherein the sweep control unit has:

a selecting unit which selects any one of the plurality of trigger signals;

a plurality of sweep units to which one of the trigger signals selected by the selecting unit is input, and which individually control the frequency sweep operations in each of the plurality of measuring units in synchronization with the trigger signal; and a delay unit which delays timing of input of the trigger signal by a predetermined length of time with respect to part of the plurality of measuring units.

* * * * *